(12) United States Patent
Park

(10) Patent No.: US 7,495,469 B2
(45) Date of Patent: Feb. 24, 2009

(54) ON-DIE TERMINATION CIRCUIT AND DRIVING METHOD THEREOF

(75) Inventor: Jung-Hoon Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/824,165

(22) Filed: Jun. 28, 2007

(65) Prior Publication Data

US 2008/0074140 A1 Mar. 27, 2008

(30) Foreign Application Priority Data

Sep. 27, 2006 (KR) .................. 10-2006-0094052

(51) Int. Cl.
*H03K 17/16* (2006.01)
(52) U.S. Cl. .................. 326/30; 326/27; 326/86; 326/87
(58) Field of Classification Search .......... 326/30, 326/87, 26, 27, 86; 327/108, 109; 333/17.3, 333/32; 365/189.05, 189.11, 202, 233.1
See application file for complete search history.

(56) References Cited

U.S. PATENT DOCUMENTS 6,326,821 B1 * 12/2001 Gabara .................. 327/112
6,456,124 B1 * 9/2002 Lee et al. .................. 327/108
2004/0008054 A1 * 1/2004 Lesea et al. .................. 326/30

FOREIGN PATENT DOCUMENTS

| JP | 2005-39549 | 2/2005 |
| KR | 10-2004-0083814 | 10/2004 |
| KR | 10-2005-0019453 | 3/2005 |
| KR | 10-2006-0066835 | 6/2006 |

* cited by examiner

*Primary Examiner*—Rexford Barnie
*Assistant Examiner*—Jany Tran
(74) *Attorney, Agent, or Firm*—Blakely, Sokoloff, Taylor & Zafman

(57) ABSTRACT

An on-die termination circuit is capable of increasing a resolution without enlargement of a chip or a layout size. The on-die termination circuit includes a control means, a termination resistance supply means, a code signal generating means. The control means sequentially generates a plurality of control signals in a response to a driving signal. The termination resistance supply means supplies a termination resistance in response to a coarse code signal having a plurality of bits and a fine code signal having a plurality of bits. The code signal generating means controls the fine code signal and the coarse code signal in response to the plurality of the control signals in order that the termination resistance has a level which is correspondent to an input resistance.

27 Claims, 6 Drawing Sheets

US 7,495,469 B2

ON-DIE TERMINATION CIRCUIT AND DRIVING METHOD THEREOF

CROSS-REFERENCE TO RELATED APPLICATIONS

The present invention claims priority of Korean patent application no. 10-2006-0094052, filed in the Korean Patent Office on Sep. 27, 2006, which is incorporated by reference in its entirety.

BACKGROUND OF THE INVENTION

The present invention relates to a semiconductor design technology; more particularly, to an on-die termination circuit capable of compensating for an error in resolution.

Generally, various semiconductor devices implemented by integrated circuits such as CPU, memories and gate arrays are used for various digital products such as personal computers, servers and work stations. For the most part, the semiconductor devices have a receiving circuit for receiving signals from external circuits through input pads and an output circuit for providing internal signals to the external circuits through output pads.

Meanwhile, as the operation speed of the digital products becomes higher, the swing of the signals which are interfaced between the semiconductor devices is decreased. The reason why the swing is getting smaller is that it is necessary to minimize the transmission time of the signals. However, the smaller the swing is, the more the semiconductor devices are influenced by external noise and the more the echo-back signal caused by impedance mismatching is serious at the interface. The impedance mismatching is generated by an external noise, a change of power supply voltage or temperature and a change of manufacturing process of the semiconductor devices. If the impedance mismatching is created, it is difficult to transmit the data at high speed and the data outputted from an output terminal of the semiconductor device can be distorted. Therefore, in the case that the semiconductor device at the receiving side receives the distorted output signal through its input terminal, the problems such as setup/hold failure or the misjudgment of an input signal level can be caused frequently.

Therefore, the semiconductor device at the receiving side, in which the high speed operation is required, employs an impedance matching circuit, which is called on-die termination, in the vicinity of a pad within the integrated circuit chip. Generally, as to the on-die termination scheme, a source termination is carried out at the transmitting side by the output circuit and a parallel termination is performed at the receiving side by a termination circuit which is in parallel coupled to a receiving circuit connected to the input pad.

FIG. 1 is a block diagram illustrating an on-die termination circuit of a conventional semiconductor memory device.

Referring to FIG. 1, the on-die termination circuit according to the conventional semiconductor memory device includes: an ODT control unit 30 for sequentially activating a plurality of control signals ODT_EN1P/N, ODT_EN2P/N and DT_UPP/N, in this order, in response to a driving signal RES; a first resistance feedback unit 20 to receive a pull-up code signal P_LEG_CD<0:4> and an input resistance ZQ for outputting a feedback pull-up resistance P_LEG_FD; a first termination resistance supply unit 10 for outputting a pull-up resistance P_LEG_RSS corresponding to the pull-up code signal P_LEG_CD<0:4>; a first code signal adjusting unit (including the reference numerals 40 and 50) for adjusting the pull-up code signal P_LEG_CD<0:4> in response to the plurality of control signals ODT_EN1P, ODT_EN2P and DT_UPP in order that the feedback pull-up resistance P_LEG_FD has a level corresponding to a reference resistance RSS_REF; a second resistance feedback unit 70 to receive a pull-down code signal N_LEG_CD<0:4> and the pull-up code signal P_LEG_CD<0:4> for outputting a feedback pull-down resistance N_LEG_FD; a second code signal adjusting unit (including the reference numerals 80 and 90) for adjusting the pull-down code signal N_LEG_CD<0:4> in response to a plurality of control signals ODT_EN1N, ODT_EN2N, DT_UPN in order that the feedback pull-down resistance N_LEG_FD has a level corresponding to the reference resistance RSS_REF; and a second termination resistance supply unit 60 for outputting a pull-down resistance N_LEG_RSS corresponding to the pull-down code signal N_LEG_CD<0:4>.

Here, the first code signal adjusting unit includes: a first level detecting unit 42 for detecting a level of the feedback pull-up resistance P_LEG_FD, based on the reference resistance RSS_REF, in response to the control signal ODT_EN1P and for outputting a pull-up detecting signal P_LEG_SN; a first amplifier 44 for amplifying the pull-up detecting signal P_LEG_SN in response to the control signal ODT_EN2P and for outputting a pull-up level signal P_LEG_DT; and a first register 50 for storing the pull-up level signal P_LEG_DT and outputting the pull-up code signal P_LEG_CD<0:4> in response to the control signal DT_UPP.

Similarly, the second code signal adjusting unit includes: a second level detecting unit 82 for detecting a level of the feedback pull-down resistance N_LEG_FD, based on the reference resistance RSS_REF, in response to the control signal ODT_EN1N and for outputting a pull-down detecting signal N_LEG_SN; a second amplifier 84 for amplifying the pull-down detecting signal N_LEG_SN in response to the control signal ODT_EN2N and for outputting a pull-down level signal P_LEG_DT; and a second register 90 for storing the pull-down level signal P_LEG_DT and outputting the pull-down code signal N_LEG_CD<0:4> in response to the control signal DT_UPN.

At the time of the activation of the driving signal RES, the ODT control unit 30 sequentially activates the control signals ODT_EN1P, ODT_EN2P and DT_UPP and then the control signals ODT_EN1N, ODT_EN2N and DT_UPN. Thereafter, this operation is repeated for a predetermined number of times under the control of the ODT control unit 30.

Even though it is not shown in FIG. 1, the pull-up resistance P_LEG_RSS and the pull-down resistance N_LEG_RSS are on-die termination resistances which are coupled to the corresponding data pads.

Also, the first level detecting unit 42 includes a current mirror type differential amplifier to which the feedback pull-up resistance P_LEG_FD and the reference resistance RSS_REF are applied and the second level detecting unit 82 also includes a current mirror type differential amplifier. The first and second amplifiers 44 and 84 respectively include a voltage cross-coupled amplifier. The first and second registers 50 and 90 respectively include a latch to latch the corresponding input signals P_LEG_DT and N_LEG_DT in response to the corresponding control signals DT_UPP/N.

FIG. 2 is a schematic circuit diagram illustrating the first resistance feedback unit 20 described in FIG. 1. Referring to FIG. 2, the first resistance feedback unit 20 includes first to fifth PMOS transistors, which are turned on in response to the corresponding pull-up code signal P_LEG_CD<0:4>, and first to fifth resistors each of which is connected between a common output node and a respective PMOS transistor. The feedback pull-up resistance P_LEG_FD is a signal corresponding to the level of voltage applied to the common output node.

The first resistance feedback unit 20 receives the input resistance ZQ at its output node and the input resistance ZQ is applied from an external circuit through an input pin. The resistance of 240Ω is applied between the input pin and a ground voltage. Therefore, in the first resistance feedback unit 20, the number of transistors, which are turned on, is determined by the pull-up code signal P_LEG_CD<0:4>. The feedback pull-up resistance P_LEG_FD is determined by parallel resistance value of resistors which are in series connected to their respective turn-on PMOS transistors.

On the other hand, the first termination resistance supply unit 10, which has the same configuration as the first resistance feedback unit 20 shown in FIG. 2, supplies the pull-up resistance P_LEG_RSS.

FIG. 3 is a schematic circuit diagram illustrating the second resistance feedback unit 70 described in FIG. 1.

As shown in FIG. 3, the second resistance feedback unit 70 includes a first resistance unit 32, which is connected to an output node, in order to supply a first code resistance corresponding to the pull-up code signal P_LEG_CD<0:4> and a second resistance unit 34, which is connected to the output node, in order to supply a second code resistance corresponding to the pull-down code signal N_LEG_CD<0:4>. The feedback pull-down resistance N_LEG_FD is a signal corresponding to the level of voltage applied to the output node.

The first resistance unit 32 includes first to fifth PMOS transistors, which are turned on in response to the corresponding pull-up code signal P_LEG_CD<0:4>, and first to fifth resistors each of which is connected between a common output node and each PMOS transistor. The second resistance unit 34 includes first to fifth resistors, each of which is connected to the common output node, and first to fifth NMOS transistors, which are disposed between the resistors and the ground voltage VSSQ and respectively turned on in response to the corresponding pull-down code signal N_LEG_CD<0:4>.

That is, the second resistance feedback unit 70 supplies the feedback pull-down resistance N_LEG_FD which is determined by a ratio of the first and second code resistance, by disposing in series both the first code resistance corresponding to the pull-up code signal P_LEG_CD<0:4> and the second code resistance corresponding to the pull-down code signal N_LEG_CD<0:4> at its output node. The second termination resistance supply unit 60, which has the same configuration as the second resistance unit 34 shown in FIG. 3, supplies the pull-down resistance N_LEG_RSS in response to the pull-down code signal N_LEG_CD<0:4>.

The operation of the on-die termination circuit shown in FIGS. 1 to 3 will be described briefly.

First, the first resistance feedback unit 20, to which the pull-up code signal P_LEG_CD<0:4> and the input resistance ZQ are applied, outputs the feedback pull-up resistance P_LEG_FD. The ODT control unit 30 sequentially activates the control signals ODT_EN1P, ODT_EN2P, DT_UPP in response to the activation of the driving signal RES. Next, the first level detecting unit 42 outputs a pull-up detecting signal P_LEG_SN by amplifying a difference between the reference resistance RSS_REF and the feedback pull-up resistance P_LEG_FD in response to the control signal ODT_EN1P.

The first amplifier 44 outputs the pull-up level signal P_LEG_DT by amplifying the pull-up detecting signal P_LEG_SN in response to the control signal ODT_EN2P. The first register 50 stores the pull-up level signal P_LE-G_DT and outputs the pull-up code signal P_LEG_CD<0:4> in response to the control signal DT_UPP.

Also, the ODT control unit 30 sequentially activates the control signals ODT_EN1N, ODT_EN2N and DT_UPN. The second resistance feedback unit 70 to which the pull-down code signal N_LEG_CD<0:4> and the pull-up code signal P_LEG_CD<0:4> are applied outputs the feedback pull-down resistance N_LEG_FD corresponding to the pull-down resistance N_LEG_RSS. The second level detecting unit 82 outputs the pull-down detecting signal N_LEG_SN by amplifying a difference between the reference resistance and the feedback pull-down resistance N_LEG_FD in response to the control signal ODT_EN1N.

Next, the second amplifier 84 outputs the pull-down level signal N_LEG_DT by amplifying the pull-down detecting signal N_LEG_SN in response to the control signal ODT_EN2N. The second register 90 stores the pull-down level signal N_LEG_DT and outputs the pull-down code signal N_LEG_CD<0:4> in response to the control signal DT_UPN.

The ODT control unit 30 repeatedly activates the control signals ODT_EN1P, ODT_EN2P, DT_UPP/ODT_EN1N, ODT_EN2N and DT_UPN in order that the above-mentioned processes are executed repeatedly for the predetermined number of times. Therefore, if the pull-up codes signal P_LE-G_CD<0:4> and the pull-down codes signal N_LEG_CD<0:4> are set through the above-mentioned processing, the first and second termination resistance supply units 10 and 60 output the pull-up resistance P_LEG_RSS and the pull-down resistance N_LEG_RSS corresponding to the input resistance ZQ.

The conventional on-die termination circuit mentioned above produces both the pull-up codes signal P_LEG_CD<0:4> and the pull-down codes signal N_LEG_CD<0:4> of 5 bits and provides the pull-up resistance P_LEG_RSS and the pull-down resistance N_LEG_RSS through the codes signal. The pull-up codes signal P_LEG_CD<0:4> and the pull-down odes signal N_LEG_CD<0:4> is set in order that the pull-up resistance P_LEG_RSS and the pull-down resistance N_LEG_RSS respectively have a value of the input resistance ZQ.

The values of the pull-up and pull-down resistance are regulated by the activation of the corresponding code of the 5 bits of codes signal. That is, according to the number of bits of the code signal, the resolution of the pull-up and pull-down resistance is changed. For example, since an increase in the number of bits of the code signal means the number of transistors and resistors which are serially connected to them is increased, the fluctuation of the pull-up and pull-down resistance is reduced. On the contrary, if the number of bits of the code signal is decreased, the fluctuation of the pull-up and pull-down resistance is increased.

Accordingly, if the number of bits of the code signal is increased and the number of resistors and transistors controlled by the code signal is increased, it is possible to obtain the high resolution. However, there is a problem in that the size of a chip and layout is enlarged due to the increment of the resistors and the MOS transistors. Moreover, the burden on the size of a chip and layout can be reduced when the number of code signals is reduced; however, the resolution is decreased and a large error may occur in the pull-up and pull-down resistance as compared with the input resistance so that a malfunction is caused during high frequency operation.

SUMMARY OF THE INVENTION

Embodiments of the present invention are directed to provide an on-die termination circuit capable of increasing a resolution without enlargement of a chip or a layout size.

In accordance with an aspect of the present invention, an on-die termination circuit includes a control means for sequentially generating a plurality of control signals in response to a driving signal, a termination resistance supply means for supplying a termination resistance in response to a coarse code signal having a plurality of bits and a fine code signal having a plurality of bits, and a code signal generating means for controlling the fine code signal and the coarse code signal in response to the plurality of the control signals so that the termination resistance has a level which corresponds to an input resistance.

In accordance with another aspect of the present invention, an on-die termination circuit includes a driving control means for sequentially generating a plurality of control signals in response to a driving signal, a first termination resistance supply means for supplying a termination pull-up resistance in response to a first coarse code signal having a plurality of bits and a first fine code signal having a plurality of bits, a first code signal generating means for controlling the first coarse and fine code signals in response to the plurality of the control signals so that the termination pull-up resistance has a level which corresponds to an input resistance, a second termination resistance supply means for supplying a termination pull-down resistance in response to a second coarse code signal having a plurality of bits and a second fine code signal having a plurality of bits, and a second code signal generating means for controlling the second coarse and fine code signals in response to the plurality of control signals so that the termination pull-down resistance has a level which corresponds to the termination pull-up resistance.

In accordance with a further aspect of the present invention, an on-die termination circuit includes at least one passive resistance group, which has a plurality of units each having a MOS transistor and a resistor, for controlling resistance coarsely in response to a first code signal, wherein in each unit resistance, the resistor is in series connected to the MOS transistor, and at least one active resistance group, which has a plurality MOS transistors, for controlling resistance finely by selectively turning on the plurality of MOS transistors in response to a second code signal, wherein the passive resistance group is in series connected to the active resistance group and the MOS transistors in the active resistance group are in parallel connected to each other.

In accordance with a further aspect of the present invention, an on-die termination circuit includes a termination resistance supply unit for supplying a termination resistance in response to a coarse code signal having a plurality of bits and a fine code signal having a plurality of bits, a resistance feedback unit for receiving the fine code signals and the coarse code signals and for outputting a feedback pull-down resistance, a coarse code generating unit for producing the coarse code signal in order that the feedback pull-down resistance has a level corresponding to a reference resistance, and a fine code generating unit for producing the fine code signal in order that the feedback pull-down resistance has a level corresponding to the reference resistance while the coarse code signal generating unit is inactivated.

In accordance with a further aspect of the present invention, a method for driving an on-die termination circuit includes controlling a coarse code signal of a plurality of bits to supply a termination resistance corresponding to an input resistance, and controlling a fine code signal of a plurality of bits to supply the termination resistance corresponding to the input resistance.

DESCRIPTION OF SPECIFIC EMBODIMENTS

Hereinafter, a semiconductor memory device in accordance with the present invention will be described in detail referring to the accompanying drawings.

Figure 4:
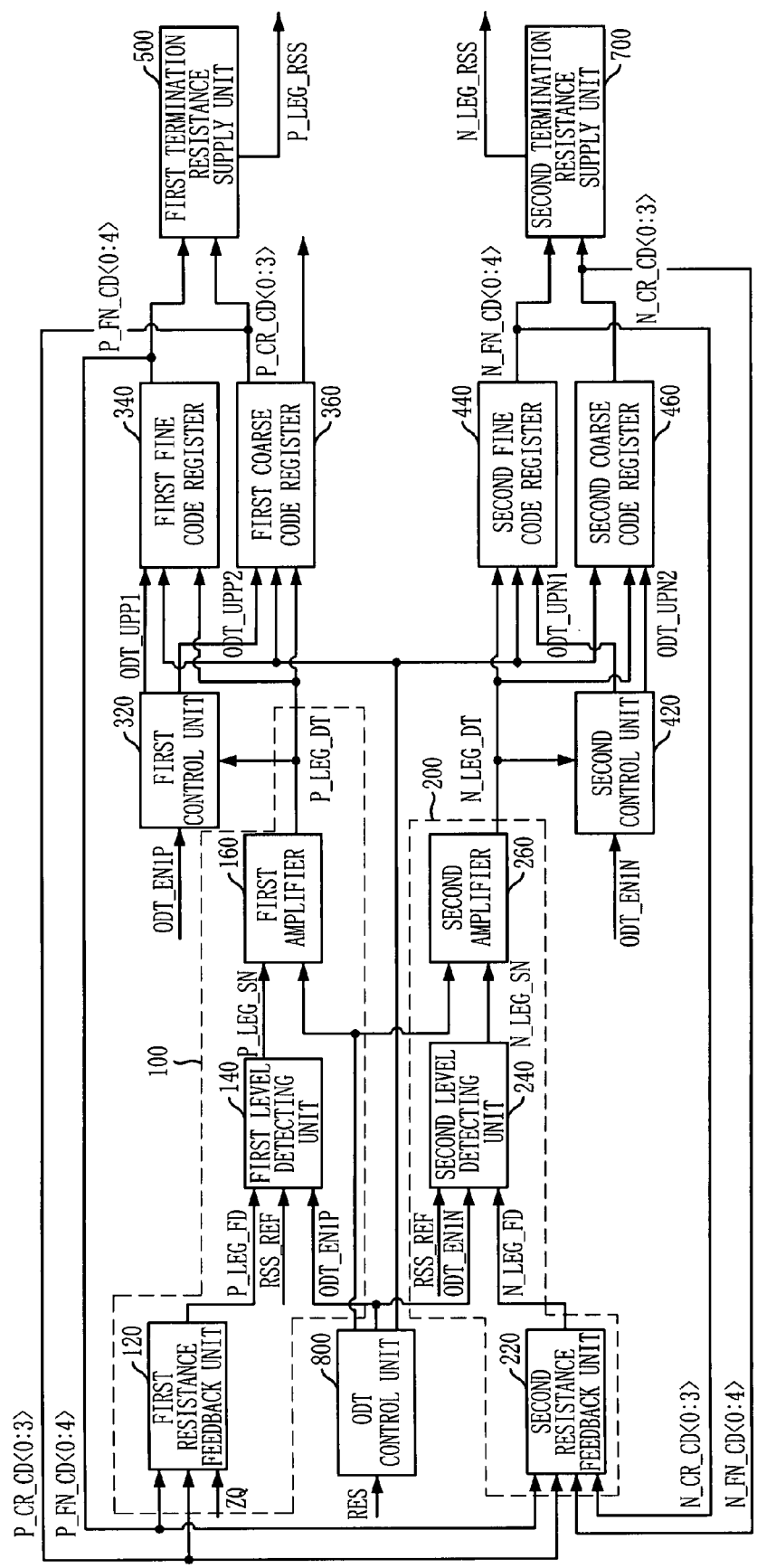
FIG. 4 is a block diagram illustrating an on-die termination circuit in accordance with an embodiment of the present invention.

FIG. 4 is a block diagram illustrating an on-die termination circuit in accordance with an embodiment of the present invention. Referring to FIG. 4, the on-die termination circuit according to the present invention includes: an ODT control unit 800 for activating a plurality of control signals ODT_EN1P/N, ODT_EN2P/N and DT_UPP/N in response to a driving signal RES; a first termination resistance supply unit 500 for supplying a pull-up resistance P_LEG_RSS corresponding to a first coarse code signal P_CR_CD<0:3> and a first fine code signal P_FN_CD<0:4>; a first code signal generating unit for producing the first fine code signal P_FN_CD<0:4> and the first coarse code signal P_CR_CD<0:3> in order that the pull-up resistance P_LEG_RSS has a level which is correspondent to an input resistance ZQ; a second termination resistance supply unit 700 for supplying a pull-down resistance N_LEG_RSS corresponding to a second coarse code signal P_CR_CD<0:3> and a second fine code signal P_FN_CD<0:4>; and a second code signal generating unit for adjusting the second fine code signal P_FN_CD<0:4> and the second coarse code signal P_CR_CD<0:3> in order that the pull-down resistance N_LEG_RSS has a level which is correspondent to the pull-up resistance P_LEG_RSS.

The first and second termination resistance supply units 500 and 700 supplies the pull-up resistance P_LEG_RSS or the pull-down resistance N_LEG_RSS by serially connecting first resistors and second resistors. The connection of the first resistors is also controlled by the corresponding first and second coarse code signals P_CR_CD<0:3> and N_CR_CD<0:3>. The connection of the second resistors is also controlled by the corresponding first and second fine code signals P_FN_CD<0:4> and N_FN_CD<0:4>. The resistance fluctuation of the first resistors according to the first and second coarse code signals P_CR_CD<0:3> and N_CR_CD<0:3> is larger than that of the second resistors according to the first and second fine code signal P_FN_CD<0:4> and N_FN_CD<0:4>. Accordingly, the variation of the pull-up or pull-down resistance can be changed by controlling the variation of the coarse and fine code signals.

Meanwhile, the first code signal generating unit includes: a first code signal generation control unit 100 for generating a pull-up level signal P_LEG_DT in response to the corresponding control signal, wherein the pull-up level signal P_LEG_DT corresponds to a level difference of the first fine code signal P_FN_CD<0:4> and the first coarse code signal P_CR_CD<0:3> based on the input resistance ZQ; a first control unit 320 for controlling a first fine code register 340 and a first coarse code register 360; a first coarse code register 360 for outputting the first coarse code signal P_CR_CD<0:3> corresponding to the pull-up level signal P_LEG_DT at the time of an activation of the corresponding control signal; and a first fine code register 340 for outing the first fine code signal P_FN_CD<0:4> corresponding to the pull-up level signal P_LEG_DT at the time of a inactivation of the first coarse code register.

The first code signal generation control unit 100 includes: a first resistance feedback unit 120, to which the input resistance ZQ, the first fine code signal P_FN_CD<0:4> and the first coarse code signal P_CR_CD<0:3> are applied, for outputting a feedback pull-up resistance P_LEG_FD; a first level detecting unit 140 for outputting a pull-up detecting signal P_LEG_SN in response to the control signal ODT_EN1P by detecting a level of the feedback pull-up resistance P_LEG_FD based on a reference resistance RSS_REF; and a first amplifier 160 for amplifying the pull-up detecting signal P_LEG_SN in response to the control signal ODT_EN2P and for-outputting the amplified signal as the pull-up level signal P_LEG_DT.

The first control unit 320 generates a first pull-up driving signal ODT_UPP1 and a second pull-up driving signal ODT_UPP2 in response to the control signal ODT_EN1P and the pull-up level signal P_LEG_DT. The first fine code register 340 outputs the first fine code signal P_FN_CD<0:4> corresponding to the pull-up level signal P_LEG_DT in response to the control signal DT_UPP and the first pull-up driving signal ODT_UPP1. The first coarse code register 360 outputs the first coarse code signal P_CR_CD<0:3> corresponding to the pull-up level signal P_LEG_DT in response to the control signal DT_UPP and the second pull-up driving signal ODT_UPP2.

The first control unit 320 activates the second pull-up driving signal ODT_UPP2 in response to the control signal ODT_EN1P. Thereafter, the first control unit 320 inactivates the second pull-up driving signal ODT_UPP2 and activates the first pull-up driving signal ODT_UPP1 when the pull-up level signal P_LEG_DT goes from a high level to a low level. In other words, at the initial driving time of the on-die termination circuit in which the control signal ODT_EN1P is activated, the first control unit 320 activates the second pull-up driving signal ODT_UPP2 so that the first coarse code register 360 is activated and then the coarse code signal having a large variation range is calculated. When the resistance value has a level corresponding to the input resistance ZQ according to the first coarse code signal P_CR_CD<0:3>, the voltage level of the pull-up level signal P_LEG_DT is changed and the fine code signal P_FN_CD<0:4> is calculated based on the activation of the first pull-up driving signal ODT_UPP1 in the first control unit 320. Therefore, the first control unit 320 makes the resistance value corresponding to the input resistance ZQ controlled in the large variation range using the first coarse code signal P_CR_CD<0:3> and thereafter performs the fine adjustment through the first fine code signal P_FN_CD<0:4>.

On the other hand, the second code signal generating unit includes: a second code signal generation control unit 200 for outputting, in response to the corresponding control signal, a pull-down level signal N_LEG_DT, which corresponds to a level difference between the second fine and coarse code signals N_FN_CD<0:4> and N_CR_CD<0:3> and the first fine and coarse code signals P_FN_CD<0:4> and P_CR_CD<0:3>; a second control unit 420 for controlling a second fine code register 440 and a second coarse code register 460; a second coarse code register 460 for outputting the second coarse code signal N_CR_CD<0:3> corresponding to the pull-down level signal N_LEG_DT in response to the corresponding control signal; and a second fine code register 440 for outputting the second fine code signal N_FN_CD<0:4> corresponding to the pull-down level signal N_LEG_DT at the time of a inactivation of the second coarse code register 460.

The second code signal generation control unit 200 includes: a second resistance feedback unit 220, to which the first and second fine code signals P_FN_CD<0:4> and N_FN_CD<0:4> and the first and second coarse code signals P_CR_CD<0:3> and N_CR_CD<0:3> are applied, for outputting a feedback pull-down resistance N_LEG_FD; a second level detecting unit 240 for outputting a pull-down detecting signal N_LEG_SN in response to the control signal ODT_EN1N by detecting a level of the feedback pull-down resistance N_LEG_FD based on the reference resistance RSS_REF; and a second amplifier 260 for amplifying the pull-down detecting signal N_LEG_SN in response to the control signal ODT_EN2N and for outputting the amplified signal as the pull-down level signal N_LEG_DT.

Meanwhile, the second control unit is the same as the first control unit, except for the input signals, and the second coarse and fine code registers also are the same as the first coarse and fine code registers. Accordingly, they will be described briefly.

The second control unit 420 generates a first pull-down driving signal ODT_UPN1 and a second pull-down driving signal ODT_UPN2 in response to the control signal ODT_EN1N and the pull-down level signal N_LEG_DT. The first fine code register 440 outputs the second fine code signal N_FN_CD<0:4> corresponding to the pull-down level signal N_LEG_DT in response to the control signal DT_UPN and the first pull-down driving signal ODT_UPN1. The second coarse code register 460 outputs the second coarse code signal N_CR_CD<0:4> corresponding to the pull-down level signal N_LEG_DT in response to the control signal DT_UPP and the second pull-down driving signal ODT_UPN2.

The second control unit 420 activates the second pull-down driving signal ODT_UPN2 in response to the control signal ODT_EN1N. Thereafter, the second control unit 420 inactivates the second pull-down driving signal ODT_UPN2 and activates the first pull-down driving signal ODT_UPN1 when the pull-down level signal N_LEG_DT goes from a high level to a low level. In other words, the second control unit 420 drives the second coarse code register 460 at the initial driving time and drives the second fine code register 440 after the transition of the pull-down level signal.

The first level detecting unit 140 includes a current mirror type differential amplifier to which the feedback pull-up resistance P_LEG_FD and the reference resistance RSS_REF are applied and the second level detecting unit 240 also includes such a current mirror type differential amplifier. The first and second amplifiers 160 and 260 include a voltage cross-coupled amplifier, respectively. Each of the first and second fines code registers 340 and 440 and the first and second coarse code registers 360 and 460 can include a latch for latching corresponding input signals P/N_LEG_DT at the time of activation of the corresponding control signals DT_UPP/N and the driving signals.

The code signal generating unit can be classifies into a coarse code signal generating unit to generate the coarse code signals P_CR_CD<0:3> and N_CR_CD<0:3> using the code signal generation control units (100 and 200), control units (320 and 340) and the coarse code register units (360 and 460) and a fine code signal generating unit to generate the fine code signals P_FN_CD<0:4> and N_FN_CD<0:4> using the code signal generation control units (100 and 200), control units (320 and 340) and the fine code register units (340 and 440).

The first and second resistance feedback units 120 and 220 respectively includes a resistance unit of which the resistance value differently ranges in response to each of the coarse code signals N_CR_CD<0:3> and P_CR_CD<0:3> and the fine code signals N_FN_CD<0:4> and P_FN_CD<0:4>. Accordingly, the variation of the feedback signal by the coarse and fine code signals is different. Also, even though it is not shown in FIG. 4, the pull-up resistance and the pull-down resistance are the on-die termination resistances which are connected to the corresponding data pads.

As described above, the on-die termination circuit according to the present invention may support the high resolution, without increasing an area of the device, and guarantee stable operation in the high frequency, by making the internal resistance of the first and second termination resistance supply units 500 and 700 and the first and second resistance feedback units 120 and 200 have a variety of fluctuation according to the corresponding input signals P_CR_CD<0:3>, N_CR_CD<0:3>, N_FN_CD<0:4> and P_FN_CD<0:4>. The present invention produces the first fine code signal P_FN_CD<0:4> and the first coarse code signal P_CR_CD<0:3>, instead of the pull-up code signal P_LEG_CD<0:4>, and the second fine code signal N_FN_CD<0:4> and the second coarse code signal N_CR_CD<0:3>, instead of the pull-down code signal N_LEG_CD<0:4>, in order to control a plurality of divided resistors individually. The coarse code signals P_CR_CD<0:3> and N_CR_CD<0:3> controls the feedback resistance P_LEG_FD and N_LEG_FD and the termination resistance P_LEG_RSS and N_LEG_RSS with a large width and sets up them to the resistance value corresponding to the input resistance ZQ at a high speed. Thereafter, the fine adjustment to the input resistance ZQ is carried out by the fine code signals P_FN_CD<0:4> and N_FN_CD<0:4>

Figure 5:
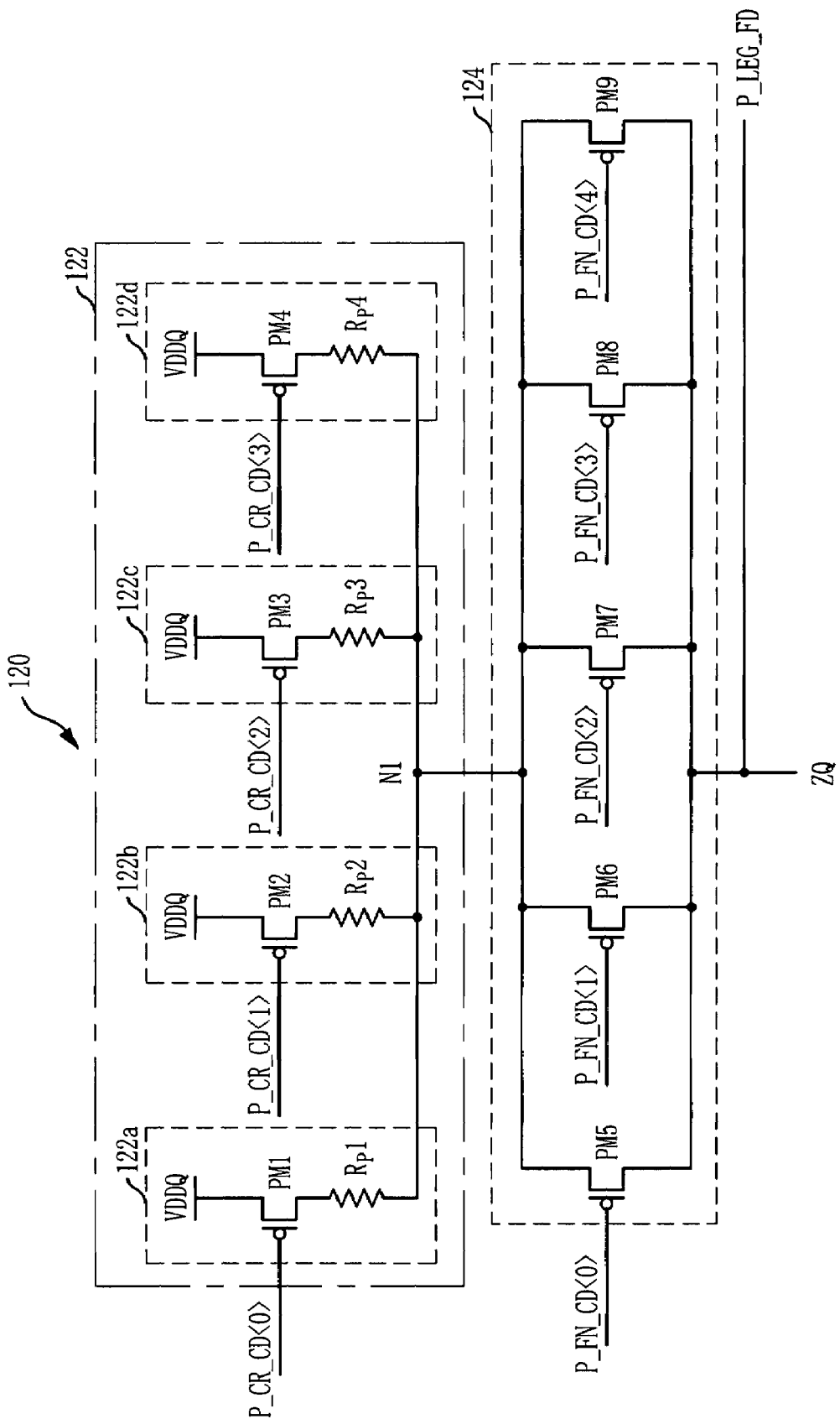
FIG. 5 is a schematic circuit diagram illustrating a first resistance feedback unit described in FIG. 4.

The resistance adjustment will be described in detail referring to a schematic circuit of the resistance feedback unit. FIG. 5 is a schematic circuit diagram illustrating the first resistance feedback unit 120 described in FIG. 4. Referring to FIG. 5, the first resistance feedback unit 120 includes a first pull-up resistance unit 122 for providing a first pull-up code resistance corresponding to the first coarse code signal P_CR_CD<0:3>, and a second pull-up resistance unit 124 for providing a second pull-up code resistance corresponding to the first fine code signal P_FN_CD<0:4>. The first and second pull-up resistance units 122 and 124 are serially connected between the power supply voltage VDDQ and an output node and a voltage applied to the output node is outputted as the feedback pull-up resistance P_LEG_FD.

The first pull-up resistance unit 122 includes a plurality of resistance units 122a, 122b, 122c and 122d which are connected to a first node N1 in response to the corresponding first coarse code signal P_CR_CD<0:3>, respectively. Since the plurality of resistance units 122a, 122b, 122c and 122d have the same structure, only one resistance unit will be described.

The resistance unit 122a includes a first PMOS transistor PM1 having a gate to receive the first coarse code P_CR_CD<0> and a source connected to the power supply voltage VDDQ, and a first resistor Rp1 which is connected between a drain of the first PMOS transistor PM1 and the first node N1.

In the second pull-up resistance unit 124, fifth to ninth PMOS transistors PM5 to PM9 which are respectively turned on by the fine code signal P_FN_CD<0:4> are in parallel connected between the first node N1 and the output node. For example, each of the first to fourth resistors in the first pull-up resistance unit 122 has one of resistance values, 240Ω, 120Ω and 60Ω. Also, the input resistance ZQ may be applied to the output node of the first resistance feedback unit 120. The input resistance ZQ is an external signal applied through the input pin which is connected to the ground voltage level through a resistance value of 240Ω. Further, the first termination resistance supply unit 500, which has the same configuration as the first resistance feedback unit 120 described in FIG. 5, provides the pull-up resistance P_LEG_RSS. Accordingly, the pull-up resistance P_LEG_RSS with the fine adjustment is provided by the fine code signal P_FN_CD<0:4>.

In the first resistance feedback unit 120, the first pull-up code resistance corresponding to the first coarse code signal P_CR_CD<0:3> is serially connected to the second pull-up code resistance corresponding to the first fine code signal P_FN_CD<0:4> between the power supply VDDQ and the output node and the feedback pull-up resistance P_LEG_FD is outputted by this serial connection of the two resistances.

More concretely, when the PMOS transistors PM1, PM2, PM3 and PM4 in the resistance units 122a, 122b, 122c and 122d are respectively turned on by the activation of the corresponding coarse code signal P_CR_CD<0:3> in the first pull-up resistance unit 122, the resistors Rp1, Rp2, Rp3 and Rp4 are connected to the first node N1 respectively so that the first pull-up code resistance is determined. In the second pull-up resistance unit 124, the PMOS transistors PM5, PM6, PM7, PM8 and PM9, which are respectively turned on by the corresponding fine code signal P_FN_CD<0:4>, are connected between to the first node N1 and the output node so that the second pull-up code resistance is determined.

The first pull-up resistance unit 122 controls the first pull-up code resistance using the passive elements of the resistors Rp1, Rp2, Rp3 and Rp4 of which resistance is larger than that of the PMOS transistors. Meanwhile, the second pull-up code resistance of the second pull-up resistance unit 124 is determined by the turn-on resistance of the PMOS transistors. Accordingly, the first pull-up resistance unit 122 can control the first pull-up code resistance in a relatively large range by using the passive elements of the resistors Rp1, Rp2, Rp3 and Rp4 and the second pull-up resistance unit 124 can control the second pull-up code resistance in a relatively small range by using the turn-on resistance of the PMOS transistors.

Therefore, being different from the conventional semiconductor device, the first resistance feedback unit 120 according to the present invention finely controls the feedback pull-up resistance P_LEG_FD by further including the second pull-up resistance unit 124 of the PMOS transistors and makes it possible to supply the termination resistance with high resolution. Also, since the second pull-up resistance unit 124 is included, the burden on the area is reduced. Particularly, even though it is possible to improve the resolution by increasing the number of unit resistors in the first pull-up resistance unit 122, this may cause the increasing of the burden on the area because the area required in the passive resistors is larger than that in the transistors.

Figure 6:
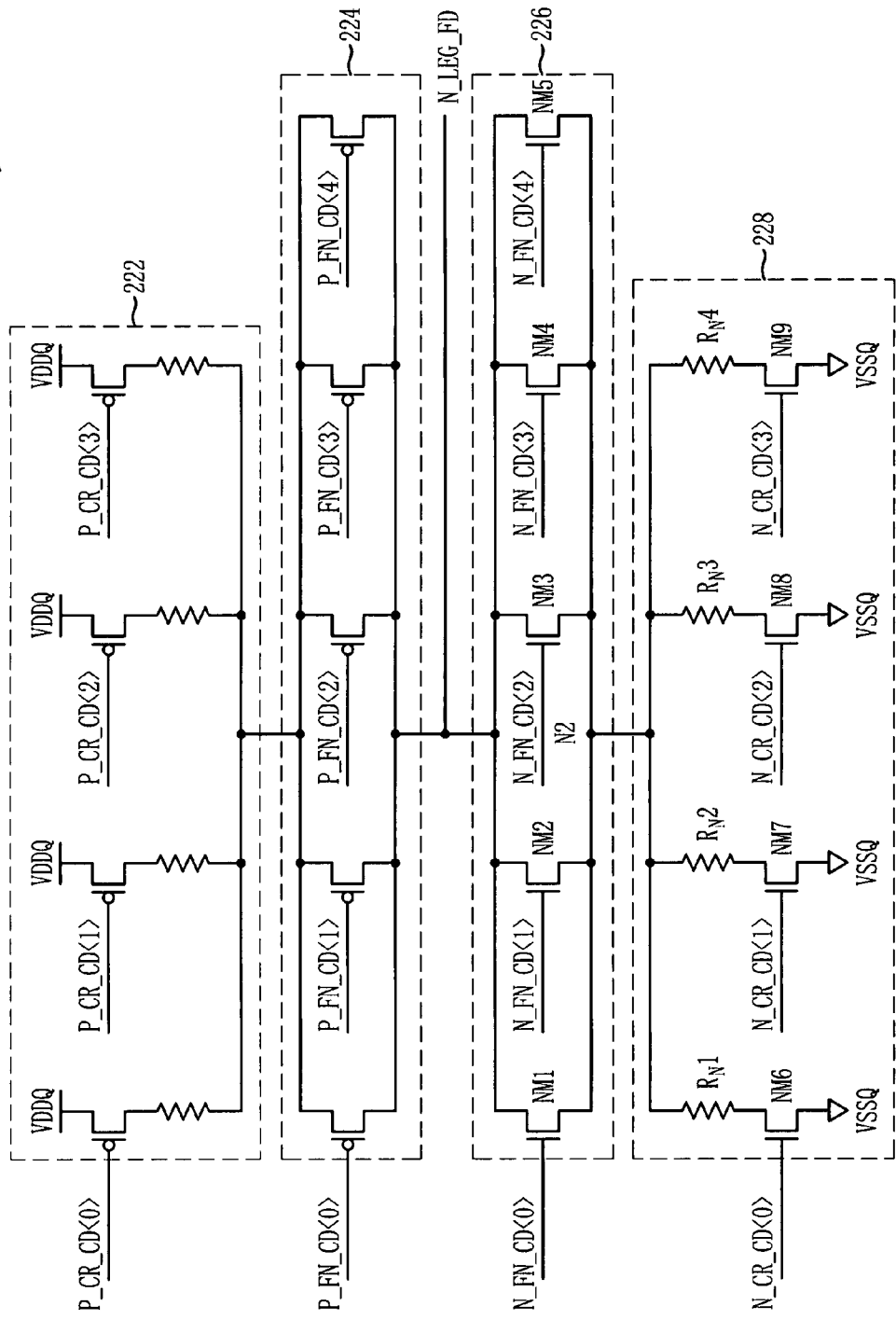
FIG. 6 is a schematic circuit diagram illustrating a second resistance feedback unit described in FIG. 4.

FIG. 6 is a schematic circuit diagram illustrating the second resistance feedback unit 220 described in FIG. 4. Referring to FIG. 6, the second resistance feedback unit 220 includes: a third pull-up resistance unit 222 for supplying a first pull-up code resistance corresponding to the first fine code signal P_FN_CD<0:4>; a fourth pull-up resistance unit 224 for supplying a second pull-up code resistance corresponding to the first coarse code signal (P_CR_CD<0:3>; a first pull-down resistance unit 226 for supplying a first pull-down code resistance corresponding the second fine code signal N_FN_CD<0:4>; and a second pull-down resistance unit 228 to supplying a second pull-down code resistance corresponding the second coarse code signal N_CR_CD<0:3>. The third and fourth pull-up resistance units 222 and 224 are in series connected to each other between the power supply voltage VDDQ and an output node and the first and second pull-down resistance units 226 and 228 are in series connected to each other between the output node and the ground voltage VSSQ. A voltage applied to the output node is outputted as the feedback pull-down resistance N_LEG_FD.

The first pull-down resistance unit 226 includes first to fifth NMOS transistors NM1, NM2, NM3, NM4 and NM5 which are in parallel connected between the output node and a second node N2 and are respectively turned on by the second fine code signal N_FN_CD<0:4>. Also, The second pull-down resistance unit 228 includes first to fourth resistors Rn1, Rn2, Rn3 and Rn4 which are in parallel connected to the second node N2 and sixth to ninth fifth NMOS transistors NM6, NM7, NM8 and NM9 which are in series connected to each of the resistors and are respectively turned on by the second coarse code signal N_CR_CD<0:3>.

On the other hand, since the third and fourth pull-up resistance units 222 and 224 have the same configuration as the first resistance feedback unit 120, the detailed description of the third and fourth pull-up resistance units 222 and 224 is not illustrated. Also, the second termination resistance supply unit 700 includes only the first and second pull-down resistance units 226 and 228 which are included in the second resistance feedback unit described in FIG. 6. Accordingly, the second termination resistance supply unit 700 supplies the pull-down resistance N_LEG_RSS which is correspondent to the second coarse code signal N_FN_CD<0:3> and the second fine code signal N_FN_CD<0:4>.

As a result, the feedback pull-down resistance N_LEG_FD supplied from the second resistance feedback unit 220 is created by a voltage ratio of the first and second pull-up code resistances to the first and second pull-down code resistances which are correspondent to the first fine and coarse code signals P_FN_CD<0:4> and P_CR_CD<0:3> and the second fine and coarse code signals N_FN_CD<0:4> and N_CR_CD<0:3>, respectively.

Figure 1:
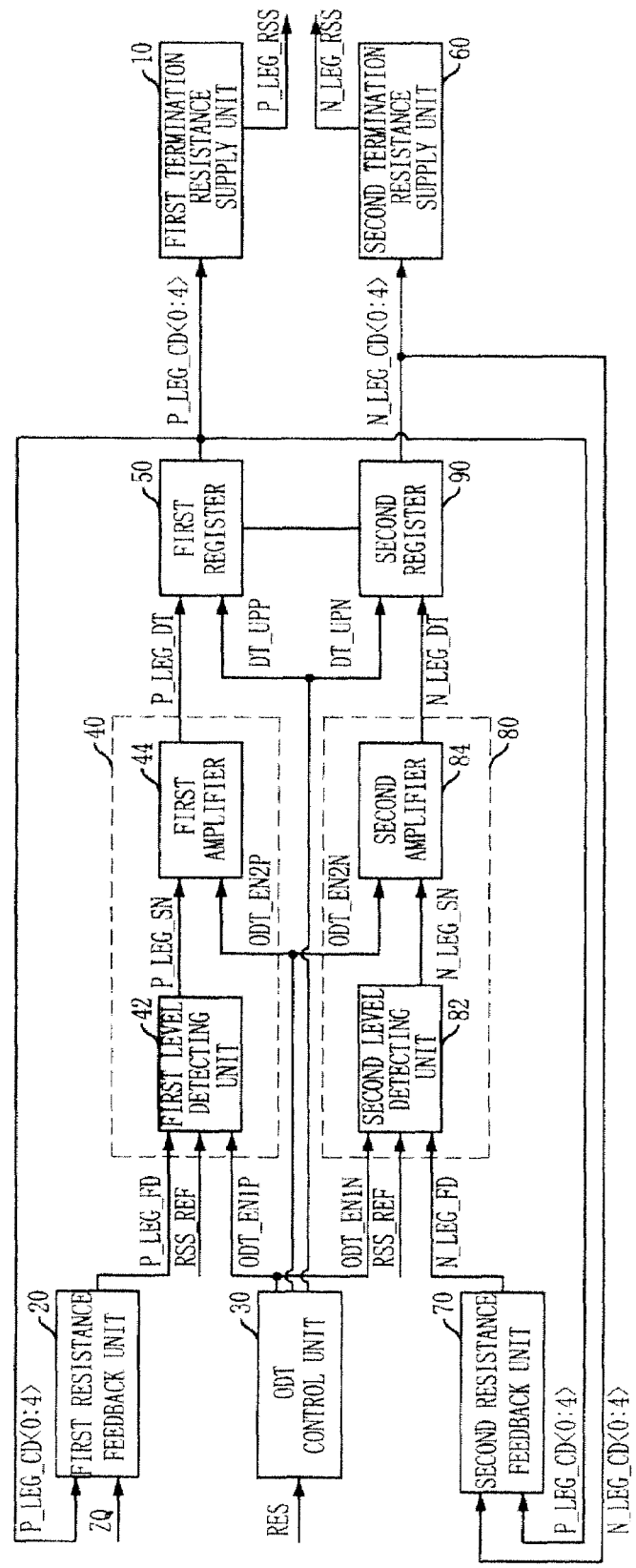
FIG. 1 is a block diagram illustrating an on-die termination circuit of a conventional semiconductor memory device.
Figure 2:
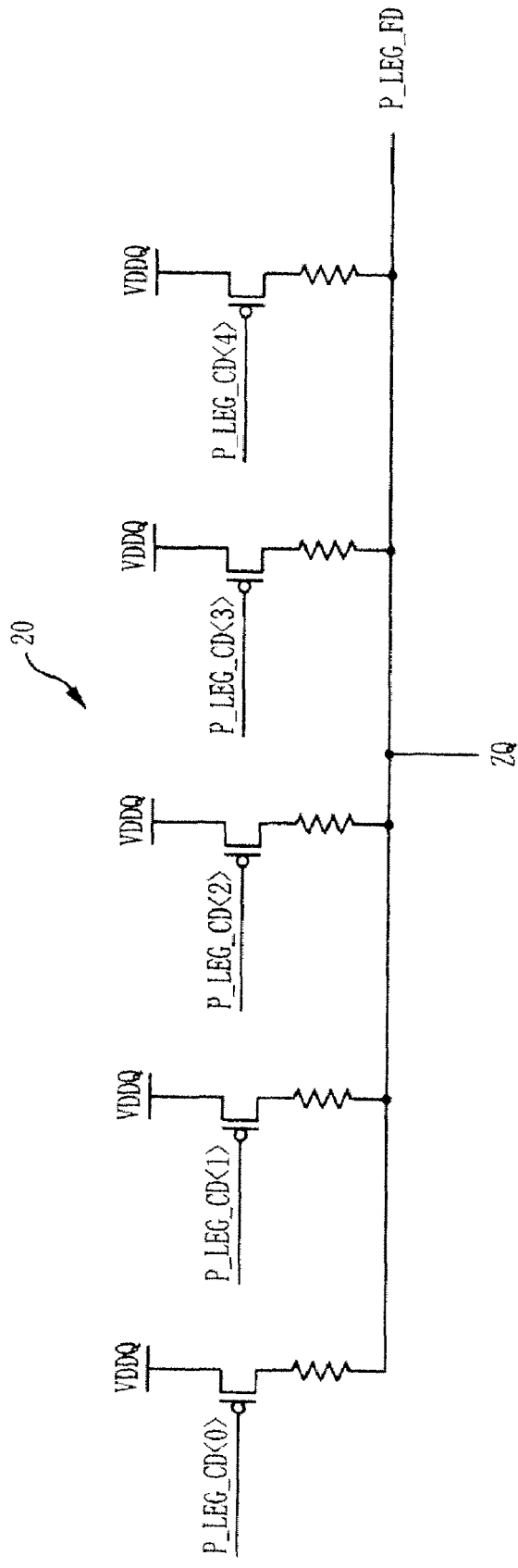
FIG. 2 is a schematic circuit diagram illustrating a first resistance feedback unit described in FIG. 1.
Figure 3:
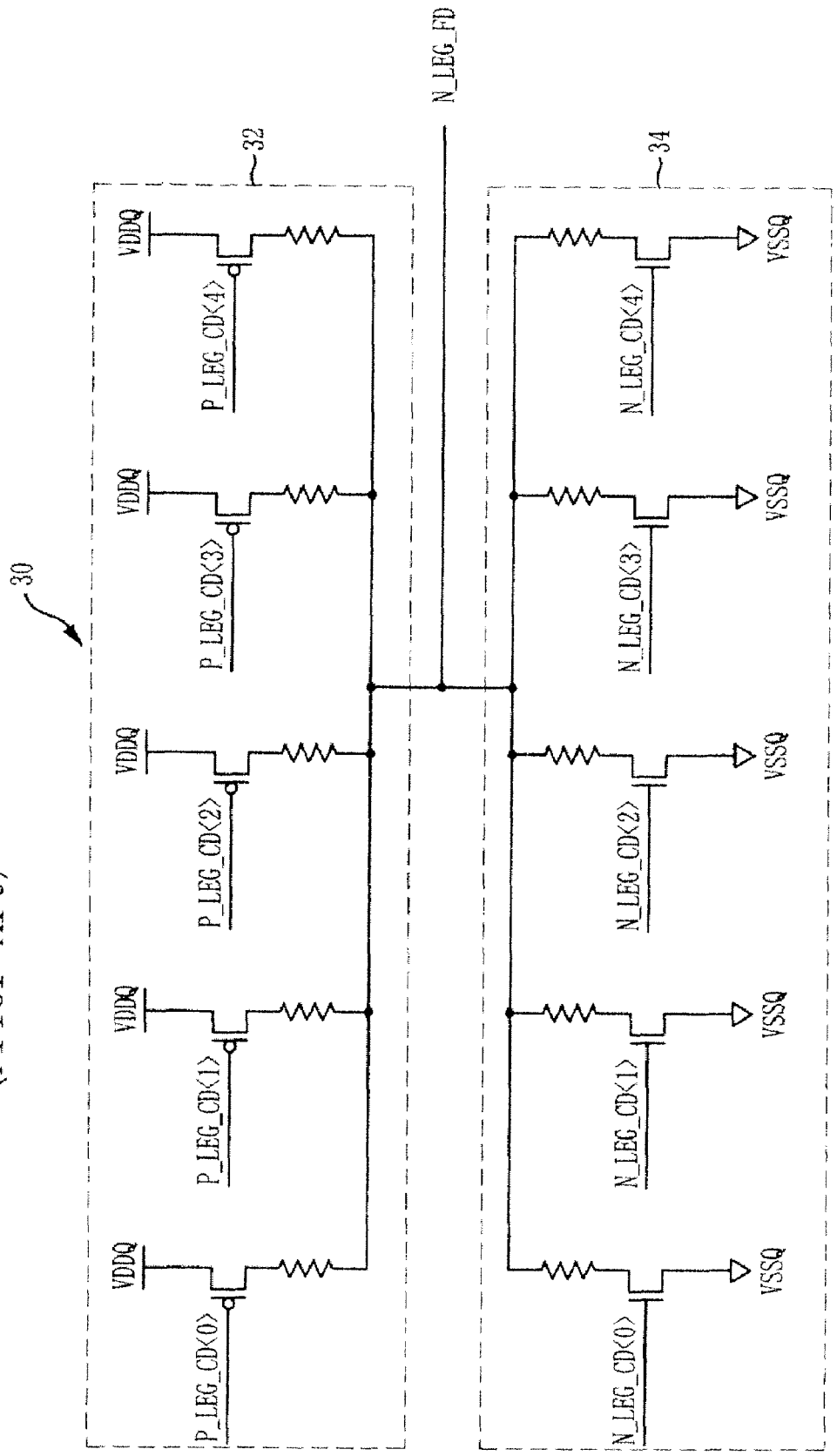
FIG. 3 is a schematic circuit diagram illustrating a second resistance feedback unit described in FIG. 1.

As mentioned above, as compared to the conventional semiconductor device described in FIG. 3, the second resistance feedback unit 220 further includes the third pull-up resistance unit 224 and the first pull-down resistance unit 226. It is possible to finely control the feedback pull-down resistance N_LEG_FD by further including the resistance units (the reference numerals 224 and 226) of MOS transistors.

Therefore, as shown in FIGS. 5 and 6, the rate of change in the feedback resistance, which is controlled by the fine and coarse code signals, can have different values. Accordingly, being different from the method where resolution is improved by simply increasing the number of bits of the code signal with large area for it, the present invention may not increase the chip area and the layout complexity as much.

The detailed operation of the on-die termination circuit according to the present invention shown in FIGS. 4 to 6 will be described below.

First, if the driving signal RES is activated, the ODT control unit 800 activates the control signals ODT_EN1P, ODT_EN2P and DT_UPP in this order. The first control unit 320 activates the second pull-up driving signal ODT_UPP2 in response to the control signal ODT_EN1P.

Next, the first code signal generation control unit 100 outputs a level difference, as the pull-up level signal P_LEG_DT, which is produced between the first coarse and fine code signals P_CR_CD<0:3> and P_FN_CD<0:4> and the input resistance ZQ. The first coarse code register 360 which is activated by the second pull-up driving signal ODT_UPP2 and the control signal DT_UPP controls the first coarse code signal P_CR_CD<0:3> in response to the logic level of the pull-up level signal P_LEG_DT.

The ODT control unit 800 activates the control signals ODT_EN1N, ODT_EN2N and DT_UPN in this order and the second control unit 420 activates the second pull-down driving signal ODT_UPN2 in response to the activation of the control signal ODT_EN1N.

Subsequently, the second code signal generation control unit 200 outputs a level difference, as the pull-down level signal N_LEG_DT, which is produced between the second coarse and fine code signals N_CR_CD<0:3> and P_FN_CD<0:4> and the first coarse and fine code signals N_CR_CD<0:3> and P_FN_CD<0:4>. The second coarse code register 460 which is activated by the second pull-down driving signal ODT_UPN2 and the control signal DT_UPN controls the second coarse code signal N_CR_CD<0:3> in response to the logic level of the pull-down level signal N_LEG_DT.

As mentioned above, the present invention controls only the first and second coarse code signals P_CR_CD<0:3> and N_CR_CD<0:3> in a relatively large range during the initial time the driving signal is applied to it. The processing of the control in the coarse code signal repeats until the feedback resistance is close to the input resistance in a range of the resolution.

When the feedback resistance has a value similar to the input resistance, the first and second control units 320 and 420 respectively actuates the first pull-up and pull-down driving signals ODT_UPP1 and ODT_UPN1 in response to the transition of each of the corresponding level signals P_LEG_DT and N_LEG_DT. At this time, since the second pull-up and pull-down driving signals ODT_UPP2 and ODT_UPN2 are not activated, the first and second coarse code registers 360 and 460 are inactivated so that the current states of the first and second coarse code signal P_CR_CD<0:3> and N_CR_CD<0:3> are stored and an update for the coarse code signal is not made any more.

Next, since the first fine code register 340 is activated by the first pull-up driving signal ODT_UPP1 and the control signal DT_UPP, the first fine code signal P_FN_CD<0:4> is controlled based on the pull-up level signal P_LEG_DT. Similarly, the second fine code register 440 is activated by the first pull-up driving signal ODT_UPP1 and the control signal DT_UPN and the second fine code signal P_FN_CD<0:4> is controlled based on the pull-down level signal N_LEG_DT.

That is, in the present invention, after setting by the coarse code signal, the feedback resistance is finely controlled to have a resistance value corresponding to the input resistance ZQ, by controlling only the first and second fine code signals P_FN_CD<0:4> and N_FN_CD<0:4>.

When the first and second coarse code signals P_CR_CD<0:3> and N_CR_CD<0:3> and the first and second fine code signals P_FN_CD<0:4> and N_FN_CD<0:4> are set, the first and second termination resistance supply units 500 and 700 provides the pull-up resistance and the pull-down resistance corresponding to them.

As set forth above, the present invention has two steps, in which the coarse driving stage controls the resistance roughly and the fine driving stage controls the resistance finely, in the set of the termination resistances N_LEG_RSS and P_LEG_RSS corresponding to the input resistance ZQ.

In other words, in the coarse driving stage, the feedback resistances P_LEG_FD and N_LEG_FD are roughly controlled to have a resistance value corresponding to the input resistance ZQ. Since a low resolution is obtained in the coarse driving stage, the coarse code signal corresponding to the input resistance may be set quickly. In the fine driving stage, the feedback resistances P_LEG_FD and N_LEG_FD are finely controlled to have the same resistance value as the input resistance ZQ.

Therefore, the on-die termination circuit according to the present invention achieves the highly controlled termination resistance with the high resolution, by further including the resistance control unit in which the resistance is controlled by the MOS transistors provided in the feedback unit and the termination resistance supply unit. Also, the semiconductor device having the termination resistance according to the present invention can be stably driven at high frequency. In the present invention, the pull-up and pull-down resistances are simultaneously employed; however, it is possible to design a termination circuit which has just one of the pull-up and pull-down resistances.

As is apparent from the above, the on-die termination circuit according to the present invention supports high resolution, without increasing an area of the device, and guarantees stable operation at high frequency, by classifying the resistance control into the coarse control processing and the fine control processing.

While the present invention has been described with respect to the particular embodiments, it will be apparent to those skilled in the art that various changes and modifications may be made without departing from the spirit and scope of the invention as defined in the following claims.

What is claimed is:

1. An on-die termination circuit comprising:
   a control unit for sequentially generating a plurality of control signals in response to a driving signal;
   a termination resistance supply unit for supplying a termination resistance in response to a coarse code signal having a plurality of bits and a fine code signal having a plurality of bits; and
   a code signal generating unit for controlling the fine code signal and the coarse code signal in response to the plurality of the control signals so that the termination resistance has a level which corresponds to an input resistance,
   wherein the code signal generating unit includes:
   a code signal generation control unit for outputting a level signal which corresponds to a difference between the fine and coarse code signals and the input resistance in response to the corresponding control signal;
   a register control unit for activating a first driving signal in response to a first control signal and for activating a second driving signal when the level signal goes from a first logic level to a second logic level;
   a coarse code register for generating the coarse code signal corresponding to the level signal in response to the first driving signal; and
   a fine code register for generating the fine code signal corresponding to the level signal in response to the second driving signal.

2. The on-die termination circuit of claim 1, wherein the termination resistance supply unit includes a first resistance unit for supplying a first code resistance corresponding to the coarse code signal and a second resistance unit for supplying a second code resistance corresponding to the fine code signal, wherein the first and second resistance units are in series coupled to each other in order to produce the termination resistance.

3. The on-die termination circuit of claim 2, wherein a minimum variation of the first code resistance is larger than that of the second code resistance.

4. The on-die termination circuit of claim 3, wherein the second resistance unit includes first to fifth MOS transistors which are in parallel connected to each other between a first node and an output node of the termination resistance supply unit and receive a bit of corresponding code of the fine code signal through a gate, respectively.

5. The on-die termination circuit of claim 4, wherein the first resistance unit includes a plurality of unit resistance parts which are selectively connected between a power supply and the first node by a corresponding code of the coarse code signal.

6. The on-die termination circuit of claim 5, wherein the unit resistance part includes:
   a sixth MOS transistor for having a gate to receive the corresponding code of the coarse code signal, being connected to the power supply; and
   a passive resistor disposed between the first node and the sixth MOS transistor.

7. The on-die termination circuit of claim 6, wherein a resistance value of the passive resistor is larger than a turn-on resistance of the first to fifth MOS transistors.

8. The on-die termination circuit of claim 1, wherein the code signal generation control unit includes:
   a resistance feedback unit for receiving the input resistance and the fine and coarse code signals and for outputting a feedback resistance;
   a level detecting unit for outputting a detecting signal in response to the first control signal by detecting a level of the feedback resistance based on a reference resistance; and
   an amplifier for amplifying the detecting signal in response to a second control signal and for outputting the amplified signal as the level signal.

9. The on-die termination circuit of claim 8, wherein the resistance feedback unit includes:
   a first feedback resistance unit for supplying a first resistance corresponding to the coarse code signal; and
   a second feedback resistance unit for supplying a second resistance corresponding to the fine code signal, being connected to the first feedback resistance unit in series.

10. The on-die termination circuit of claim 9, wherein the second feedback resistance unit includes seventh to eleventh MOS transistors, each of which receive the fine code signal through a gate, in parallel disposed between a second node and an output node of the resistance feedback unit.

11. The on-die termination circuit of claim 10, wherein the first feedback resistance unit includes a plurality of unit feedback resistance parts which respectively connect the power supply to the second node in response to a corresponding code of the coarse code signal.

12. The on-die termination circuit of claim 11, wherein the unit feedback resistance part includes:
   a twelfth MOS transistor for having a gate to receive the corresponding code of the coarse code signal, being connected to the power supply; and
   a passive resistor connected between the twelfth MOS transistor and the second node.

13. The on-die termination circuit of claim 1, wherein the coarse code register generates the coarse code signal of plurality of bits based on a logic level of the level signal when a third control signal and the second driving signal are activated.

14. The on-die termination circuit of claim 13, wherein the fine code register generates the fine code signal of plurality of bits based on a logic level of the level signal when a third control signal and the second driving signal are activated.

15. An on-die termination circuit comprising:
a driving control means for sequentially generating a plurality of control signals in response to a driving signal;
a first termination resistance supply means for supplying a termination pull-up resistance in response to a first coarse code signal having a plurality of bits and a first fine code signal having a plurality of bits;
a first code signal generating means for controlling the first coarse and fine code signals in response to the plurality of the control signals so that the termination pull-up resistance has a level which corresponds to an input resistance;
a second termination resistance supply means for supplying a termination pull-down resistance in response to a second coarse code signal having a plurality of bits and a second fine code signal having a plurality of bits; and
a second code signal generating means for controlling the second coarse and fine code signals in response to the plurality of control signals so that the termination pull-down resistance has a level which corresponds to the termination pull-up resistance,
wherein the second code signal generating means includes:
a first resistance feedback unit for receiving the first and second fine code signals and the first and second coarse code signals and for outputting a feedback pull-down resistance;
a first coarse code generating unit for producing the second coarse code signal in order that the feedback pull-down resistance has a level corresponding to a reference resistance; and
a first fine code generating unit for producing the second fine code signal in order that the feedback pull-down resistance has a level corresponding to the reference resistance while the first coarse code signal generating unit is inactivated.

16. The on-die termination circuit of claim 15, wherein the first resistance feedback unit includes:
a first resistance unit for supplying a first feedback resistance corresponding to the first coarse code signal;
a second resistance unit for supplying a second feedback resistance corresponding to the first fine code signal;
a third resistance unit for a third feedback resistance corresponding to the second coarse code signal; and
a fourth resistance unit for supplying a fourth feedback resistance corresponding to the second fine code signal, wherein the first resistance feedback unit supplies the feedback pull-down resistance by connecting in series the first and second resistance units between a first supply voltage and an output node and the third and fourth resistance units between a second supply voltage and the output node.

17. The on-die termination circuit of claim 16, wherein a minimum variation of the first and third feedback resistance is larger than that of the second and fourth feedback resistance.

18. The on-die termination circuit of claim 17, wherein the second and fourth resistance unit includes first to fifth MOS transistors each of which has a gate to receive an input signal and are in parallel connected to each other.

19. The on-die termination circuit of claim 18, wherein the first and third resistance unit includes:
sixth to ninth MOS transistors each of which receives an input signal through a gate, being connected to each other; and
first to fourth passive resistors which are connected to sixth to ninth MOS transistors, respectively.

20. The on-die termination circuit of claim 19, wherein the first coarse code generating unit includes:
a level detecting unit for outputting a pull-down detecting signal by detecting a level of the feedback pull-down resistance based on the reference resistance in response to a first control signal;
an amplifier for amplifying the pull-down detecting signal in response to a second control signal and for outputting the amplified signal as a pull-down level signal;
a first register control unit for activating a first pull-down driving signal in response to the first control signal and for producing a second pull-down driving signal when the pull-down level signal goes from a first logic level to a second logic level; and
a first coarse register for generating the second coarse code signal based on a logic level of the pull-down level signal in response to a third control signal and the first pull-down driving signal.

21. The on-die termination circuit of claim 20, wherein the fine code generating unit includes a first fine register for generating the second fine code signal based on a logic level of the pull-down level signal and in response to the third control signal and the first pull-down driving signal.

22. The on-die termination circuit of claim 21, wherein the first code signal generating means includes:
a second resistance feedback unit for receiving the first fine and coarse code signals based on the input resistance and for outputting a feedback pull-up resistance;
a second coarse code generating unit for producing the first coarse code signal in order that the feedback pull-up resistance has a level corresponding to the reference resistance; and
a second fine code generating unit for producing the first fine code signal in order that the feedback pull-up resistance has a level corresponding to the reference resistance while the second coarse code signal generating unit is inactivated.

23. The on-die termination circuit of claim 22, wherein the second resistance feedback unit includes:
a first pull-up feedback resistance unit for supplying a first code resistance corresponding to the first coarse code signal; and
a second pull-up feedback resistance unit for supplying a second code resistance corresponding to the first fine code signal, wherein the second resistance feedback unit supplies the feedback pull-up resistance by connecting in series the first and second pull-up feedback resistance units.

24. The on-die termination circuit of claim 23, wherein a minimum variation of the first code resistance is larger than that of the second code resistance.

25. An on-die termination circuit comprising:
a termination resistance supply unit for supplying a termination resistance in response to a coarse code signal having a plurality of bits and a fine code signal having a plurality of bits;
a resistance feedback unit for receiving the fine code signals and the coarse code signals and for outputting a feedback pull-down resistance;

a coarse code generating unit for producing the coarse code signal in order that the feedback pull-down resistance has a level corresponding to a reference resistance; and a fine code generating unit for producing the fine code signal in order that the feedback pull-down resistance has a level corresponding to the reference resistance while the coarse code signal generating unit is inactivated, wherein the resistance feedback unit includes:

a first feedback resistance unit for supplying a first resistance corresponding to the coarse code signal; and a second feedback resistance unit for supplying a second resistance corresponding to the fine code signal, being connected to the first feedback resistance unit in series.

26. A method for driving an on-die termination circuit comprising:

generating a plurality of control signals in response to a driving signal;

supplying a termination resistance in response to a coarse code signal having a plurality of bits and a fine code signal having a plurality of bits; and controlling the fine code signal and the coarse code signal in response to the plurality of control signals so that the termination resistance has a level which corresponds to an input resistance, wherein generating a plurality of control signals includes:

outputting a level signal which corresponds to a difference between the fine and coarse code signals and the input resistance in response to the corresponding control signal;

activating a first driving signal in response to a first control signal and for activating a second driving signal when the level signal goes from a first logic level to a second logic level;

generating the coarse code signal corresponding to the level signal in response to the first driving signal; and generating the fine code signal corresponding to the level signal in response to the second driving signal.

27. The method of claim 26, wherein a minimum variation of the termination resistance which is controlled by the fine code signal is smaller than that of the termination resistance which is controlled by the coarse code signal.

* * * * *